United States Patent
Murayama

(10) Patent No.: US 7,221,816 B2
(45) Date of Patent: May 22, 2007

(54) SUBSTRATE, SEMICONDUCTOR DEVICE, METHOD OF MANUFACTURING SUBSTRATE, AND METHOD OF MANUFACTURING SEMICONDUCTOR DEVICE

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/181,116

(22) Filed: Jul. 14, 2005

(65) Prior Publication Data

US 2006/0013525 A1   Jan. 19, 2006

(30) Foreign Application Priority Data

Jul. 16, 2004   (JP)   ............... 2004-210191

(51) Int. Cl.
G02B 6/26 (2006.01)
G02B 6/42 (2006.01)
G02B 6/36 (2006.01)

(52) U.S. Cl. ............... 385/15; 385/31; 385/39; 385/52; 385/53; 385/88

(58) Field of Classification Search ............ 385/15, 385/31, 39, 52, 53, 88
See application file for complete search history.

(56) References Cited

U.S. PATENT DOCUMENTS

| | | | | |
|---|---|---|---|---|
| 4,721,352 A | * | 1/1988 | Sorin et al. | 385/11 |
| 4,934,785 A | * | 6/1990 | Mathis et al. | 385/68 |
| 6,461,059 B2 | * | 10/2002 | Ando et al. | 385/94 |
| 6,669,537 B2 | * | 12/2003 | Maeda et al. | 451/41 |
| 6,904,190 B2 | * | 6/2005 | Korenaga et al. | 385/14 |
| 2002/0142095 A1 | * | 10/2002 | Motoyama et al. | 427/255.6 |

FOREIGN PATENT DOCUMENTS

JP   2004 054003   2/2004

* cited by examiner

*Primary Examiner*—Brian Healy
*Assistant Examiner*—Jerry Martin Blevins
(74) *Attorney, Agent, or Firm*—Ladas & Parry LLP

(57) ABSTRACT

A substrate for mounting an optical element having a light emission/reception part is disclosed. The substrate includes a base material and an optical waveguide penetrating through the base material. The optical waveguide is positioned opposite to the light emission/reception part. The base material is formed of silicon.

10 Claims, 11 Drawing Sheets

SUBSTRATE, SEMICONDUCTOR DEVICE, METHOD OF MANUFACTURING SUBSTRATE, AND METHOD OF MANUFACTURING SEMICONDUCTOR DEVICE

BACKGROUND OF THE INVENTION

1. Field of the Invention

The present invention generally relates to a substrate, a semiconductor device, a method of manufacturing a substrate, and a method of manufacturing a semiconductor device, and more particularly to a substrate, a semiconductor device, a method of manufacturing a substrate, and a method of manufacturing a semiconductor device for mounting an optical element for converting optical signals to electric signals.

2. Description of the Related Art

Development of optical communication is advancing along with the increases in speed and size of recent information communication. Ordinarily, in optical communication, electric signals are converted to optical signals, the optical signals are transmitted through an optic fiber, and the received optical signals are converted to electric signals. In the conversion between the electric signals and the optical signals, an optical element having a light emission/reception part is used. The optical element includes, for example, a vertical cavity surface emitting laser (VCSEL), a photodiode (hereinafter referred to as "PD"), and a laser diode (hereinafter referred to as "LD").

In a semiconductor device provided with such optical element, the optical element is mounted on the semiconductor device in a manner where the light emission/reception part of the optical element faces toward a core part of an optical fiber provided in a through-hole penetrating a substrate of the semiconductor device.

A conventional semiconductor device 10 including optical elements 15 and 16 is described with reference to FIG. 1. FIG. 1 is a cross-sectional view showing the semiconductor device 10 having the optical elements 15, 16. The semiconductor device 10 mainly includes a substrate 11, optical elements 15, 16 having light emission/reception parts 15A, 16A, an optic waveguide 17, and mirrors 21, 22.

The substrate 11 has a multilayer structure having multiple wires and a resin layer provided to a resin substrate. The substrate 11 is formed with through-holes 12a, 12b that penetrate through the substrate 11. The through-hole 12a is provided with an optical fiber 13, and the through-hole 12b is provided with an optical fiber 14. The optical fibers 13, 14 include core parts 13a, 14a, and clad parts 13b, 14b that cover the core parts 13a, 14a. Optical signals are transmitted by the core parts 13a, 14a.

The optical elements 15 and 16 are mounted on the substrate 11. The optical element 15 is mounted on the substrate 11 in a manner that the light emission/reception part 15A of the optical element 15 faces toward the portion of the core part 13a that is situated at an end part 13A of the optical fiber 13. Furthermore, the optical element 16 is mounted on the substrate 11 in a manner that the light emission/reception part 16A of the optical element 15 faces toward the portion of the core part 14a that is situated at an end part 14A of the optical fiber 14. The mirror 21 is provided at the end part 13B of the optical fiber 13 and the mirror 22 is provided at the end part 14B of the optical fiber 14. The mirrors 21, 22 are provided for enabling optical transmission between the optic waveguide 17 and the optical fibers 13, 14.

The optic waveguide 17 is provided between the mirror 21 and the mirror 22. The optic waveguide 17 includes a core part 18 and a clad part 19 that covers the periphery of the core part 18. The mirrors 21, 22 are connected to the core part 18 in a state that allows optical signals to be transmitted therethrough (See, for example, Japanese Laid-Open Patent Application No. 2004-54003).

In the semiconductor 10, it is desirable to reduce deviation between the positions of the core parts 13a of the optical fibers 13, 14 (attached to the through-holes 12a, 12b) and the positions of the corresponding light emission/reception parts 15A, 16A facing the core parts 13a, 13b, so that transmission loss between the optical fibers 13, 14 and the light emission/reception parts 15A, 16A can be reduced.

FIG. 2 is a plane view of the substrate 11 having the optical fiber 13 attached to the through-hole 12a. However, in the semiconductor device 10, since the through-holes 12a, 12b corresponding to the optical fibers 13, 14 are formed by irradiating a laser (e.g. a YAG laser, a $CO_2$ laser, an excimer laser) to a resin substrate, it is difficult to form the through-holes 12a, 12b in a precise predetermined position facing the light emission/reception parts 15A, 16A of the optical elements 15, 16 and it is difficult to control the size of the diameters of the through-holes 12a, 12b.

Furthermore, since a large space L1 (e.g. 10 μm) is provided between the wall of the through-hole 12a, 12b having diameter R2 and the optical fiber 13, 14 having outer diameter R1 for enabling attachment between the optical fibers 13, 14 and the through-holes 12a, 12b, it is difficult to restrict the position of the optical fibers 13, 14 with the walls of the through-holes 12a, 12b. Accordingly, the position of the core parts 13a, 14a of the optical fibers 13, 14 attached to the through-holes 12a, 12b tends to deviate from the position of the corresponding light emission/reception parts 15A, 16A, thereby making it difficult to reduce transmission loss of optical signals.

Furthermore, even if the position between the core parts 13a, 14a and the light emission/reception parts 15A, 16A is optimized, the resin substrate in which the through-holes 12a, 12b are formed may change the position of the optical fibers 13, 14 attached to the through-holes 12a, 12b in a case where thermal contraction or thermal expansion of the resin occurs when the temperature of the substrate 11 changes. This results in an increase of transmission loss of optical signals.

SUMMARY OF THE INVENTION

It is a general object of the present invention to provide a substrate, a semiconductor device, a method of manufacturing a substrate, and a method of manufacturing a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a substrate, a semiconductor device, a method of manufacturing a substrate, and a method of manufacturing a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a substrate for mounting an optical element having a light emission/reception part, the substrate including: a base material; and an optical waveguide penetrating through the base material, the optical waveguide being positioned opposite to the light emission/reception part; wherein the base material is formed of silicon.

In the substrate according to an embodiment of the present invention, the base material may further include: a first through-hole to which the optical waveguide is attached; a second through-hole having a via for electrically connecting to the optical element; wherein the first and second through-holes are anisotropic-etched holes.

In the substrate according to an embodiment of the present invention, the second through-hole may have a wall provided with an insulating layer.

In the substrate according to an embodiment of the present invention, the via may be provided with a connection pad on one side thereof, wherein the one side is situated opposite from the other side of the via for connecting to the optical element.

Furthermore, the present invention provides a semiconductor device including: a plurality of the optical elements according to an embodiment of the present invention; and a plurality of the substrates according to an embodiment of the present invention.

Furthermore, the present invention provides a method of manufacturing a substrate for mounting an optical element having a light emission/reception part, the substrate having a base material and an optical waveguide penetrating through the base material, the method including the steps of: forming the base material with a silicon material; forming a first through-hole and a second through-hole in the substrate by anisotropic etching.

In the method according to an embodiment of the present invention, the first through-hole and the second through-hole may be formed simultaneously.

In the method according to an embodiment of the present invention, the method may further include the steps of: forming an insulating layer at least at a wall of the second through-hole; attaching the optical waveguide to the first through-hole; forming a via in the second through-hole; and polishing a protruding part of the optical waveguide protruding from the first through-hole.

In the method according to an embodiment of the present invention, the method may further include a step of providing a connection pad on one side of the via, wherein the one side is situated opposite from the other side of the via for connecting to the optical element.

Furthermore, the present invention provides a method of manufacturing a plurality of substrates for mounting optical elements having light emission/reception parts, each of the substrates having a base material and an optical waveguide penetrating through the base material, the method comprising the steps of: forming the base material with a silicon material; forming a first through-hole and a second through-hole in the substrate by anisotropic etching; mounting the optical elements on the substrates; cutting out the substrates mounted with the optical elements by dicing the base material.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

[First Embodiment]

Figure 1:
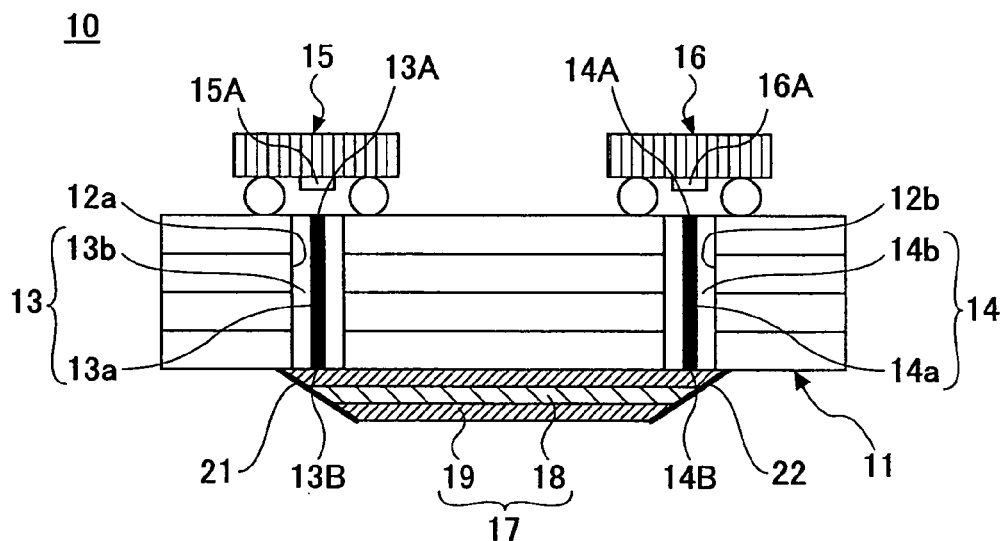
FIG. 1 is a cross-sectional view showing a conventional semiconductor device having an optical element.
Figure 2:
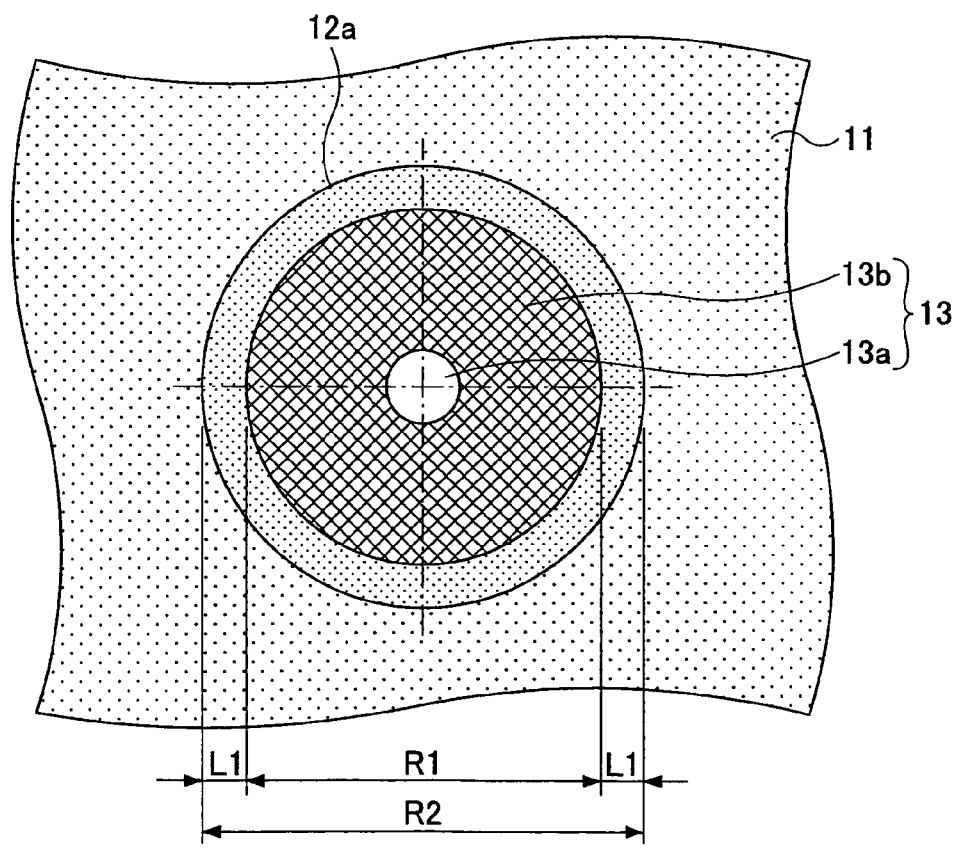
FIG. 2 is a plane view of a substrate having an optical fiber attached to a through-hole.
Figure 3:
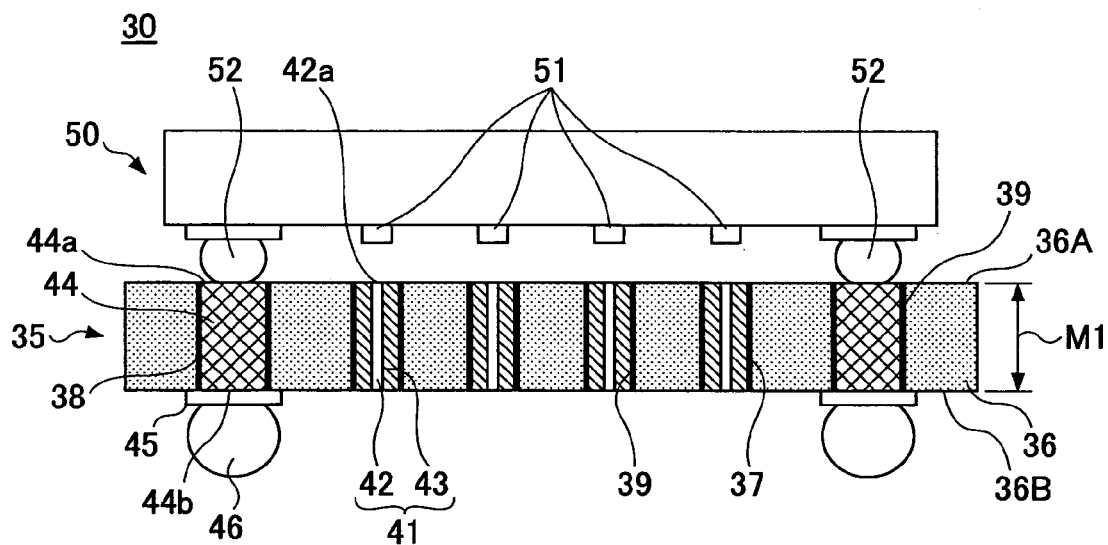
FIG. 3 is a cross-sectional view showing a semiconductor device according to a first embodiment of the present invention.
Figure 4:
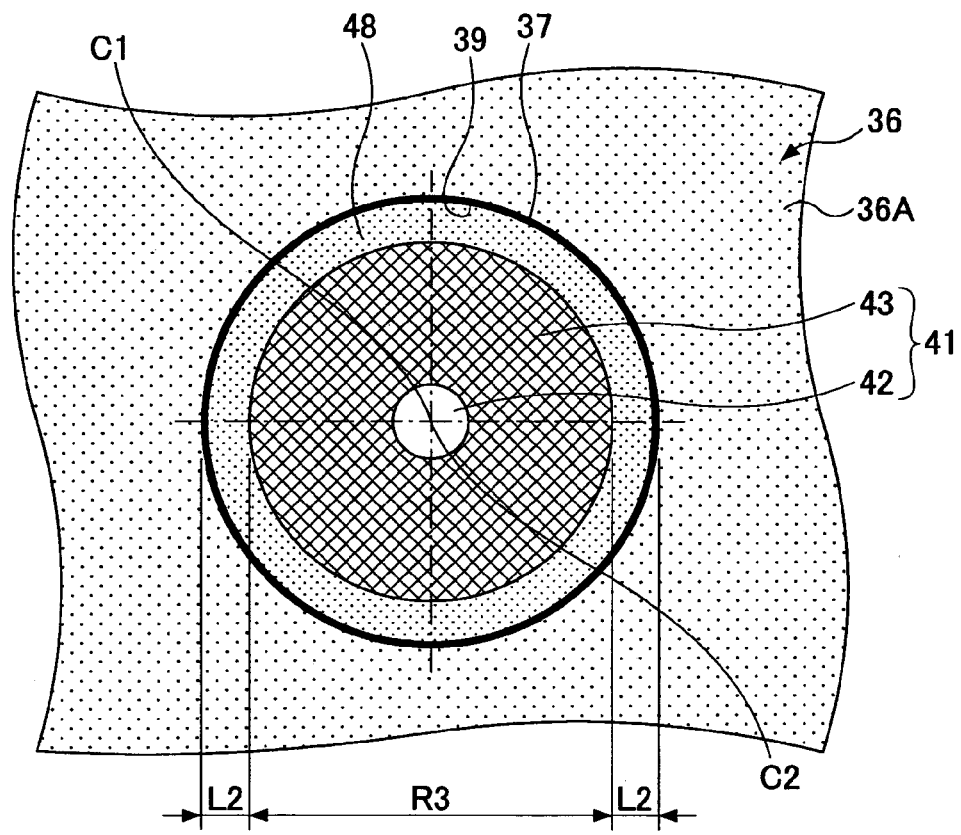
FIG. 4 is an enlarged plane view showing a part of a substrate having an optical fiber attached thereto.

A semiconductor device 30 according to a first embodiment of the present invention is described with reference to FIGS. 3 and 4. FIG. 3 is a cross-sectional view of the semiconductor device 30 according to the first embodiment of the present invention. FIG. 4 is an enlarged plane view showing a part of a substrate having an optical fiber attached thereto. It is to be noted that, although there is shown in FIG. 3 only a single optical element 50 mounted on a substrate 35, multiple optical elements 50 may be mounted on the substrate 35. Furthermore, in FIG. 3, a plane 36A of a base material 36 indicates a plane of the base material 36 facing the side on which the optical element 50 is mounted, and a plane 36B of the base material 36 indicates a plane of the base material 36 facing the side to which a motherboard (not shown) is mounted. In FIG. 4, a center axis C1 of a core part 42 of an optical fiber 41 is matched to a center axis C2 of a through-hole 37. Furthermore, in FIG. 4, L2 indicates a space formed between the wall of the through-hole 37 provided with an insulating layer 39 and an outer diameter R3 of the optical fiber 41 (hereinafter referred to as "space L2", which space L2 has the insulating layer 39 and an adhesive material 48 included therein).

The semiconductor device 30 mainly includes the optical element 50 and the substrate 35. The optical element 50 is an optical element for conducting conversion between electric signals and optic signals. The optical element 50 includes light emission/reception parts 51 and solder balls 52 serving as external connection terminals. Multiple light emission/reception parts 51 are provided to the optical element 50 for receiving optical signals transmitted from the optical fibers 41 and/or for transmitting optical signals from the optical element 50 to the optical fibers 41. The optical element 50 includes, for example, a vertical cavity surface emitting laser (VCSEL), a photodiode (hereinafter referred to as "PD"), and a laser diode (hereinafter referred to as "LD"). The solder balls 52 are provided for electrically connecting between the optical element 50 and the substrate 35. The optical element 50 is mounted on the substrate 35 in a manner having the light emission/reception parts 51 facing toward the core parts 42 of the optical fibers 41 in the substrate 35.

The substrate 35 is an interposer 35. The substrate mainly includes the base material 36, the through-hole 37 (first through-hole), a through-hole 38 (second through-hole), the insulating layer 39, the optical fiber 41 (optic waveguide), a via 44, an Ni/Au metal layer 45, and solder balls 46 (external connection terminals).

Silicon is employed as the material of the base material 36. The base material 36 is formed with the through-hole 37 for having the optical fiber 41 extend therethrough and attached to the wall of the through-hole, and with the through-hole 38 for having the via 44 provided therein. Furthermore, the base material 36 is formed with a thickness M1 of, for example, approximately 150 μm.

Since silicon, which is less vulnerable to heat compared to resin, is employed as the material of the base material 36, displacement between the through-hole 37 and the light emission/reception part 51 (i.e. displacement between the core part 42 of the optical fiber 41 and the light emission/reception part 51) and deformation of the through-hole 37 can be prevented in a case where temperature of the substrate 35 is changed by heat from outside. Accordingly, in the case where temperature of the substrate 35 is changed by heat from outside, the relative position between the core part 42 of the optical fiber 41 attached to the through-hole 37 and the light emission/reception part 51 can be prevented from changing. Thereby, transmission loss of optical signals between the optical fiber 41 and the light emission/reception part 51 can be reduced.

The through-holes 37, 38 are formed simultaneously by using anisotropic etching. The anisotropic etching may be, for example, dry etching. The through-holes 37 are formed in a manner facing the light emission/reception parts 51.

Compared to the conventional method of forming the through-holes 12a, 12b for the optical fibers by applying a laser to the resin base material 11, the method according to an embodiment of the present invention is able to attain greater precision in the position between the through-holes 37 and the light emission/reception parts 51 and reduce transmission loss of optical signals between the optical fibers 41 and the light emission/reception parts 51 owing that the through-holes 37 in which the optical fibers 41 are mounted are formed by dry etching the base material 36 made of silicon.

Furthermore, since precision in the size of the through-holes 37 can be improved by using the dry etching technique, the space L2 between the walls of through-holes 37 and the optical fibers 41 can be reduced. The walls of the through-holes 37 serve to secure the position of the optical fibers 41 with respect to the light emission/reception parts 51. Thereby, transmission loss of optical signals between the optical fibers 41 and the light emission/reception parts 51 can be reduced.

The through-holes 38 are holes to which the vias 44 are formed. The insulating layer 39 is formed at the side walls of the through-holes 37, 38 (part of the base material 36 corresponding to the through-holes 37, 38). The insulating layer 39 is a layer for insulating the vias 44 in the through-holes 38 and the base material 36 made of silicon. The insulating layer 39 may be, for example, an oxide film. The oxide film may be formed, for example, by an oxide furnace. It is to be noted that, FIGS. 3 and 4 show an example where the oxide film made by the oxide furnace is used as the insulating layer 39. Although the insulating layer 39 is formed to both the walls of the through-holes 37 and those of the through-holes 38, the insulating layer 39 is to be formed at least with respect to the walls of the through-holes 38 to which the vias 44 are formed.

The optical fibers 41 are adhesively fixed to the walls of the through-holes 37 via an adhesive material 48. The optical fibers 41 include the core part 42 and a clad part 43 that covers the core part 42. The core part 42 is a part for transmitting optical signals. The clad part 43 is a part for protecting the core part 42. An end part 42a of the core part 42 situated toward the plane 36A of the base material 36 is provided in a manner facing the light emission/reception part 51.

The vias 44 are provided in the through-holes 38. The walls of the through-holes 38 have the insulating layer 39 provided thereto. By providing the insulating layer 39 to the side walls of the through-holes 38, the base material 36 made of silicon and the vias 44 can be insulated.

An end part 44a of the via 44 situated toward the plane 36A of the base material 36 the is electrically connected to the solder ball 52 provided to the optical element 52. For example, copper (Cu) may be used as the material of the via 44. Furthermore, the via 44 may be formed, for example, with an electro-plating method.

The solder ball 46 is electrically connected to an end part 44b of the via 44 situated toward a plane 36B of the base material 36 via a Ni/Au alloy layer 45. The solder ball 46 serves an external connection terminal when mounting on a motherboard (not shown). The Ni/Au alloy layer 45 is a layer for increasing the bonding strength between the via 44 and the solder ball 46.

As described above, by dry-etching the base material 36 made of silicon for forming the through-holes 37 for attachment to the optical fibers 41, displacement between the light emission/reception parts 51 of the optical element 50 and the core parts 42 of the optical fibers 41 attached to the through-holes 37 can be reduced. Accordingly, transmission loss of optical signals between the optical fiber 41 and the light emission/reception part 51 can be reduced.

Figure 5:
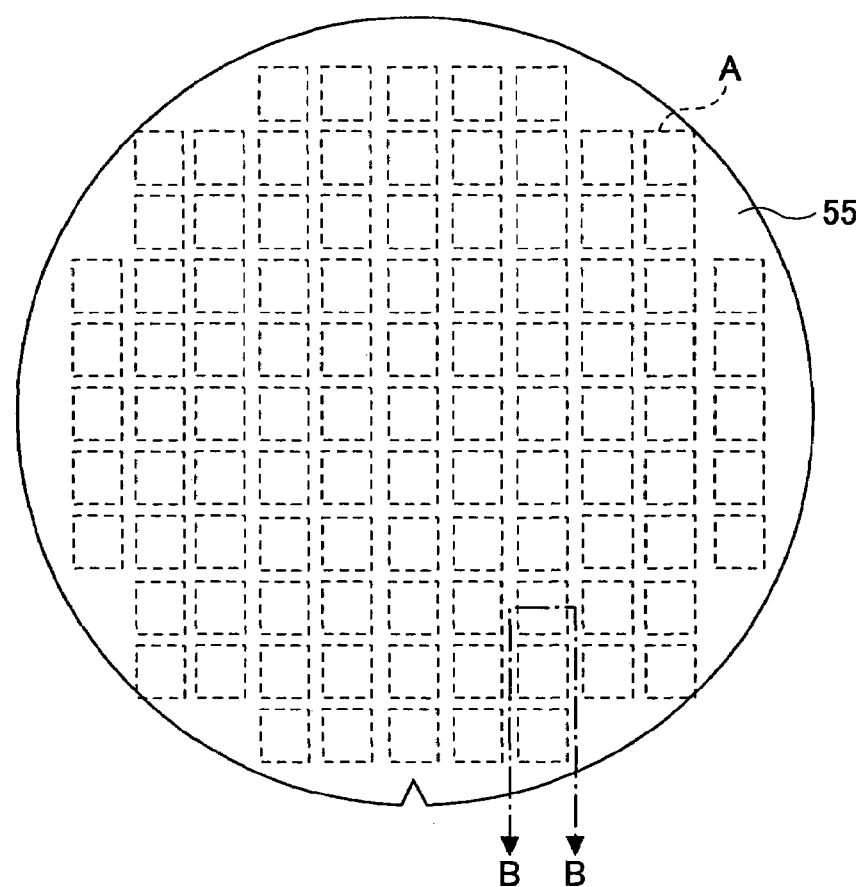
FIG. 5 is a plane view of a silicon wafer for showing the area in which substrates are formed.
Figure 6:
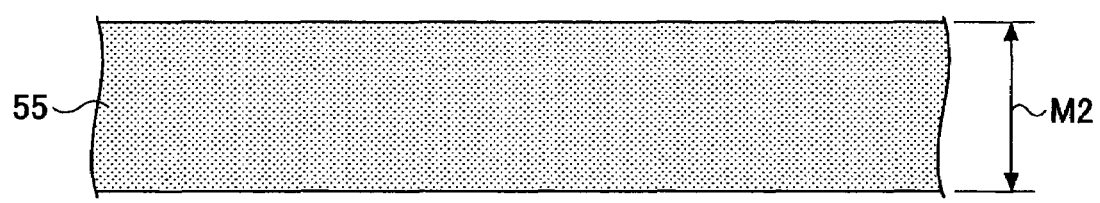
FIG. 6 is a cross-sectional view of a silicon waver along the direction of line B—B of FIG. 5.

Next, a method of manufacturing the semiconductor device 30 according to the first embodiment of the present invention is described with reference to FIGS. 5–19. It is to be noted that, the method of manufacturing the semiconductor device 30 according to the first embodiment of the present invention is described by mainly explaining the method of manufacturing the substrate 35. FIG. 5 is a plane view of a silicon wafer for showing the area in which substrates are formed. FIG. 6 is a cross-sectional view of a silicon wafer along the direction of line B—B of FIG. 5. It is to be noted that area A in FIG. 5 indicates the area in which the substrate 35 is formed. Furthermore, FIGS. 7 to 19 are cross-sectional views (corresponding to the cross-section of the silicon wafer taken along line B—B of FIG. 5) showing the processes of manufacturing a semiconductor device according to the first embodiment of the present invention (Part 1–13).

As shown in FIG. 5, the silicon wafer 55 is used as a parent material for forming multiple substrates 35 at once by performing the manufacturing method shown in FIGS. 7 to 19. Accordingly, by forming multiple substrates 35 on a single silicon wafer 55, the productivity of the substrates 35 can be increased and manufacturing cost of the substrates 35 can be reduced. A commercially available silicon wafer used for forming semiconductor chips, for example, may be employed as the silicon wafer 55. A commercially available silicon wafer 55, shown for example in FIG. 6 may have a thickness of approximately 700–800 µm.

Figure 7:
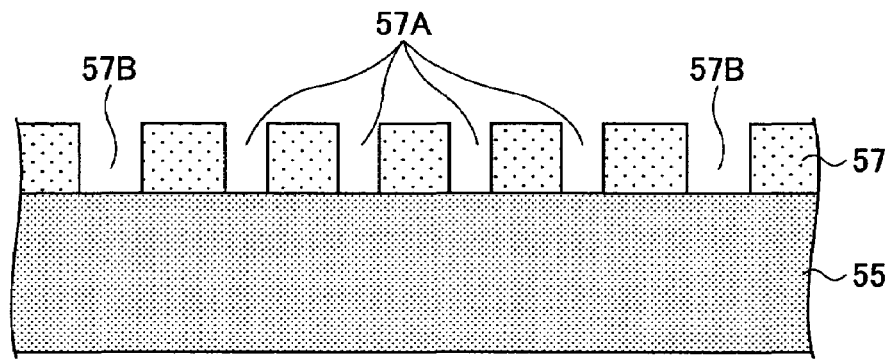
FIG. 7 is a cross-sectional view showing a process of manufacturing a semiconductor device according to a first embodiment of the present invention (Part 1)
Figure 8:
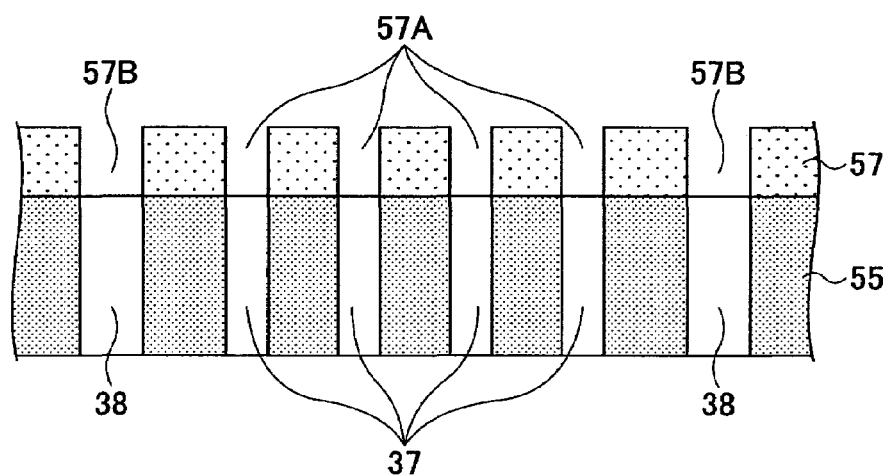
FIG. 8 is a cross-sectional view showing a process of manufacturing a semiconductor device according to a first embodiment of the present invention (Part 2)

First, as shown in FIG. 7, a resist film 57 is formed on the silicon wafer 55. The resist film 57 includes aperture parts 57A for forming the through-holes 37 and aperture parts 57B for forming the through-holes 38. Next, as shown in FIG. 8, the resist film 57 is used as a mask for etching the silicon wafer 55 with an anisotropic etching method (in this example, dry-etching), and the silicon wafer 55 is etched until it is penetrated. In the illustrated exemplary embodiment, here the through-holes 37 (first through-holes) and the through-holes 38 (second through-holes) are simultaneously formed in the silicon wafer 55. The diameter of the through-hole 37 may be adaptively set according to the outer diameter of the optical fiber 41 that is to be attached to the through-hole 37. For example, the diameter of the through-hole 37 may be set so that the size of the space L2 (FIG. 4) is approximately 1 µm. Furthermore, the diameter of the through-hole 38 to which the via 44 is to be provided may be, for example, 50–100 µm.

Figure 9:
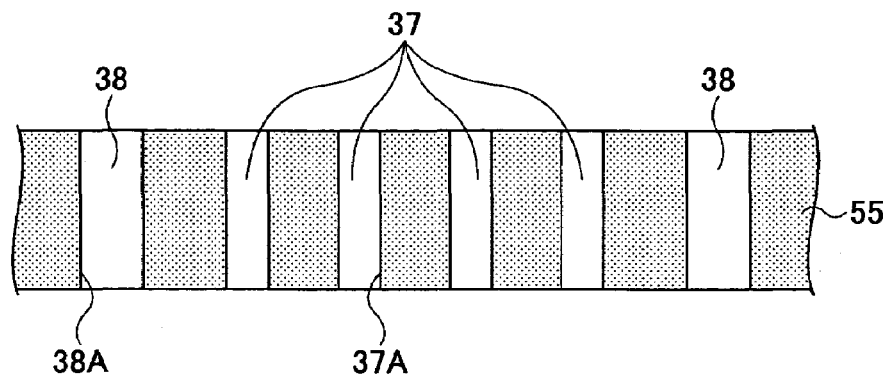
FIG. 9 is a cross-sectional view showing a process of manufacturing a semiconductor device according to a first embodiment of the present invention (Part 3)
Figure 10:
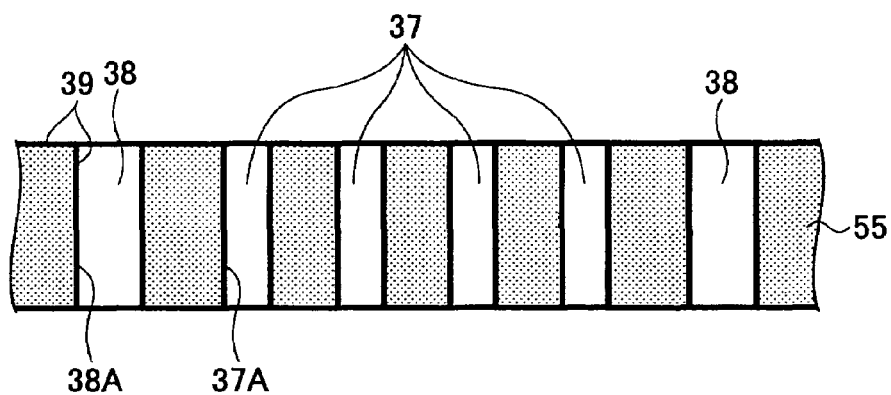
FIG. 10 is a cross-sectional view showing a process of manufacturing a semiconductor device according to a first embodiment of the present invention (Part 4)

Then, as shown in FIG. 9, the resist film 57 is removed by using a resist releasing liquid. Next, as shown in FIG. 10, the insulating layers 39 are formed in the walls 37A, 38A of the through-holes 37, 38. The insulating layer 39 may be for example, an oxide film. The oxide film is formed by, for example, employing an oxide furnace for oxidizing the silicon wafer 55 having the through-holes 37, 38 formed therein. In a case of forming the oxide film with the oxide furnace, the oxide film is formed at the walls 37A, 38A of the through-holes 37, 38 and the front and back planes of the silicon wafer 55. It is to be noted that FIG. 10 shows an example of forming the insulating layer 39 (oxide film) by using an oxide furnace.

Figure 11:
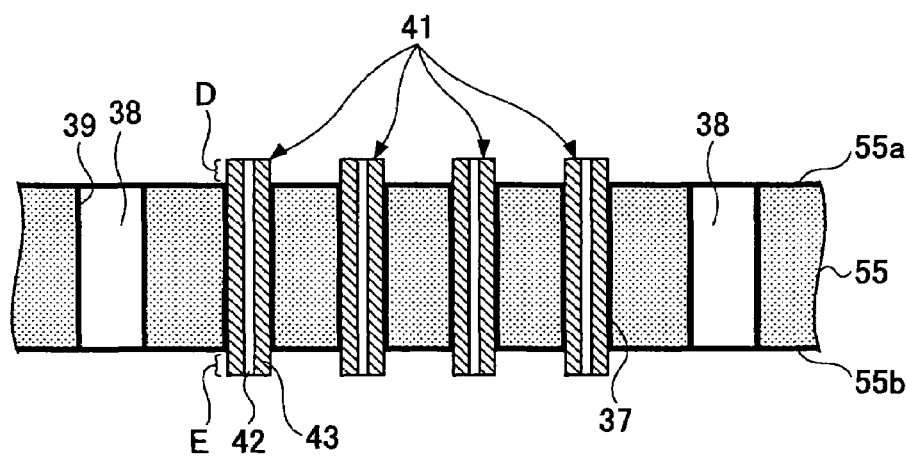
FIG. 11 is a cross-sectional view showing a process of manufacturing a semiconductor device according to a first embodiment of the present invention (Part 5)

Next, as shown in FIG. 11, the optical fibers 41 (optic waveguides) are inserted in the through-holes 37 and are attached to the walls 37A of the through-holes 37 by using an adhesive agent. In this step, the optical fibers 41 have protruding parts D and E protruding from planes 55a and 55b of the silicon wafer 55.

Figure 12:
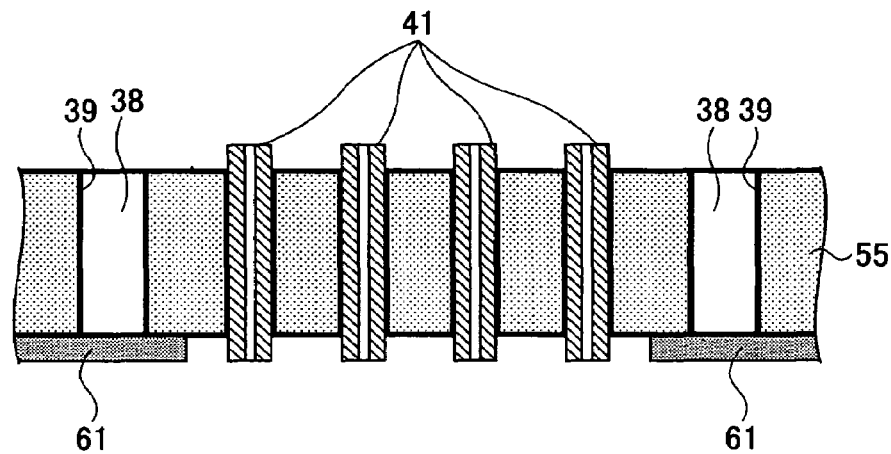
FIG. 12 is a cross-sectional view showing a process of manufacturing a semiconductor device according to a first embodiment of the present invention (Part 6)
Figure 13:
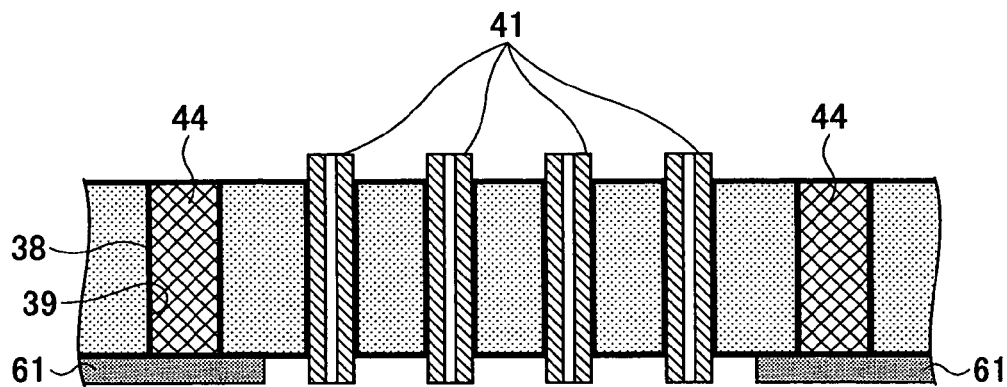
FIG. 13 is a cross-sectional view showing a process of manufacturing a semiconductor device according to a first embodiment of the present invention (Part 7)

Next, as shown in FIG. 12, copper foils 61 (copper foils for supplying electric power) are disposed in a manner covering a bottom end part of the through-holes 38. The copper foils 61 serve as power supply layers when forming alloy layers to the through-holes 38. Next, as shown in FIG. 13, a Cu film is formed in the through-holes 38 by an electro-plating method, to thereby form the vias 44.

Figure 14:
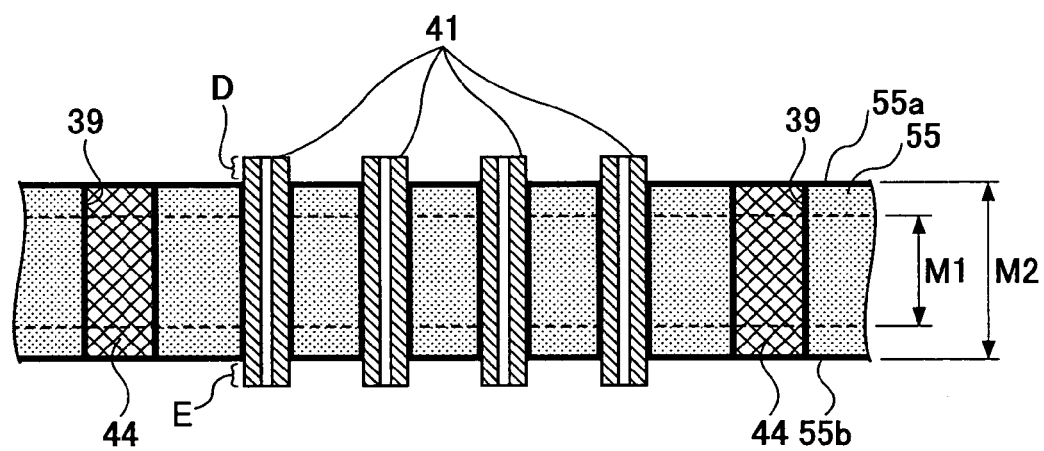
FIG. 14 is a cross-sectional view showing a process of manufacturing a semiconductor device according to a first embodiment of the present invention (Part 8)

Next, as shown in FIG. 14, both planes of the silicon wafer 55 are polished for forming the base material 36 with a desired thickness M1. In this step, at the same time, the protruding parts D, E of the optical fibers are also polished. In the polishing process, a backside grinder, for example, may be used. In a case where the backside grinder is used, the silicon wafer 55 is polished one side at a time.

Figure 15:
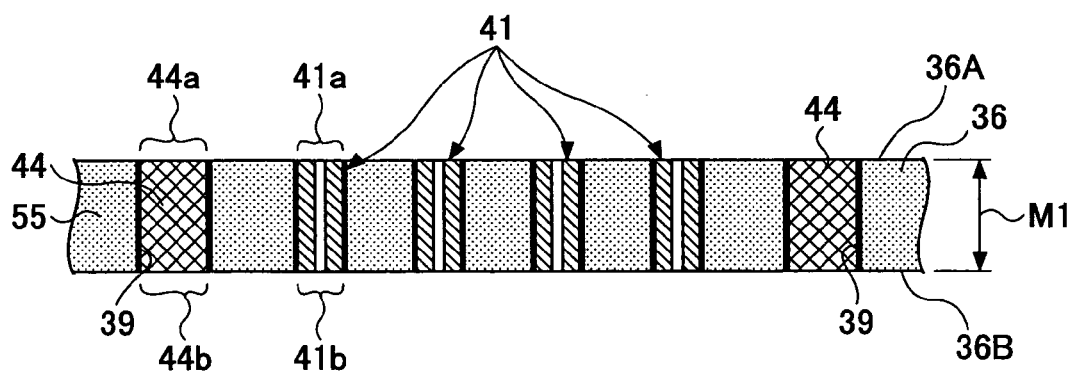
FIG. 15 is a cross-sectional view showing a process of manufacturing a semiconductor device according to a first embodiment of the present invention (Part 9)

Next, as shown in FIG. 15, the base material 36 with a desired thickness M1 is obtained. As a result of the polishing process, the end parts 44a of the vias 44 and the end parts 41a of the optical fibers become aligned at the same level (same plane) with the plane 36A of the base material 36, and the end parts 44b of the vias 44 and the end parts 41b of the optical fibers become aligned at the same level (same plane) with the plane 36B of the base material 36.

Figure 16:
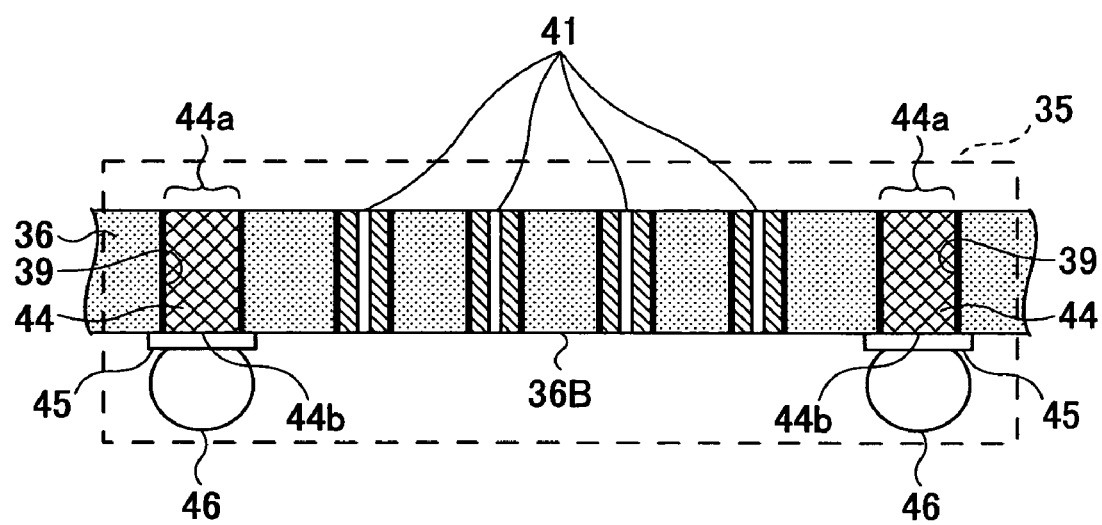
FIG. 16 is a cross-sectional view showing a process of manufacturing a semiconductor device according to a first embodiment of the present invention (Part 10)

Next, as shown in FIG. 16, the Ni/Au alloy layers 45 are formed at the end parts 44b of the vias 44. Then, the solder balls 46 serving as external connection terminals are formed on the Ni/Au alloy layers 45. Accordingly, multiple substrates 35 in a connected state (multiple substrates 35 in an inseparate state) are fabricated simultaneously.

Figure 17:
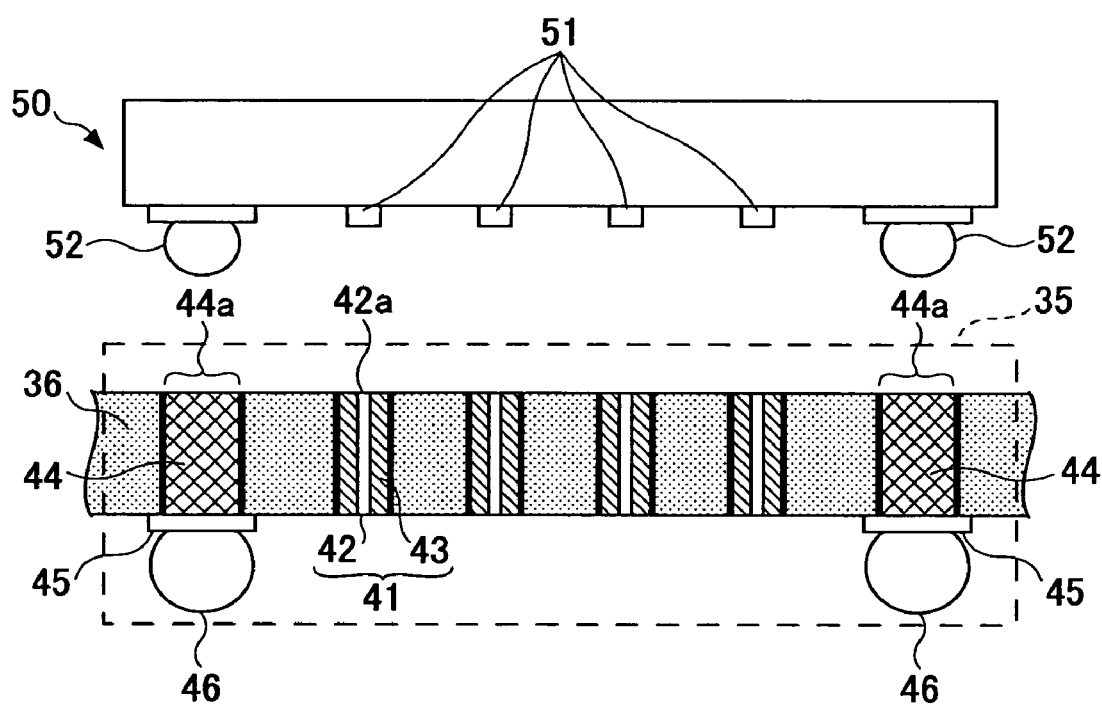
FIG. 17 is a cross-sectional view showing a process of manufacturing a semiconductor device according to a first embodiment of the present invention (Part 11)

Next, as shown in FIG. 17, the position between the light emission/reception parts 51 of the optical element 50 and the end parts of the core part 42 are adjusted by monitoring the position with a photo-detection measurement apparatus (not shown), to thereby determine an optimum position on the base material 36 for mounting the optical element 50 (hereinafter referred to as "optimum position").

Figure 18:
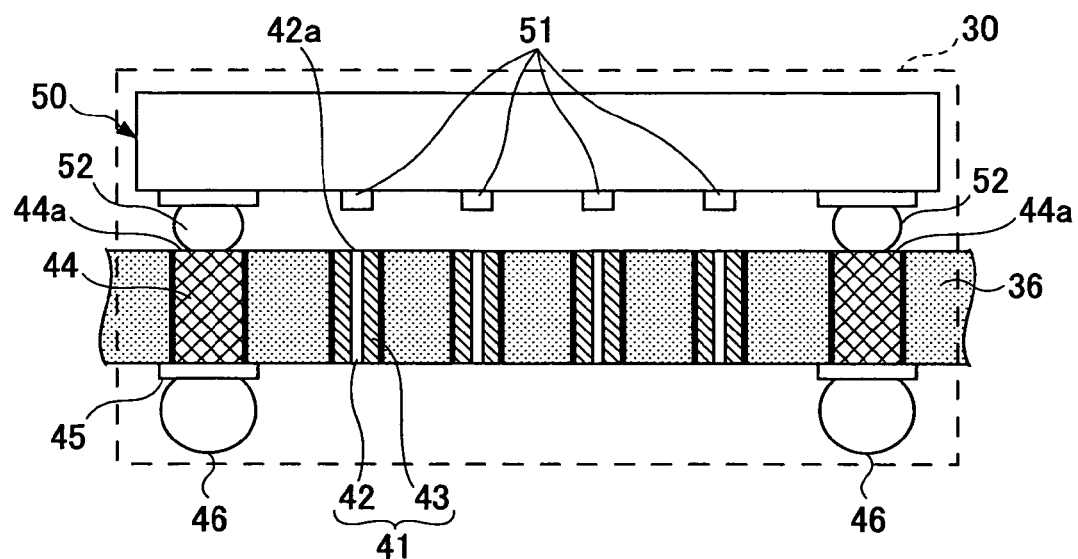
FIG. 18 is a cross-sectional view showing a process of manufacturing a semiconductor device according to a first embodiment of the present invention (Part 12)
Figure 19:
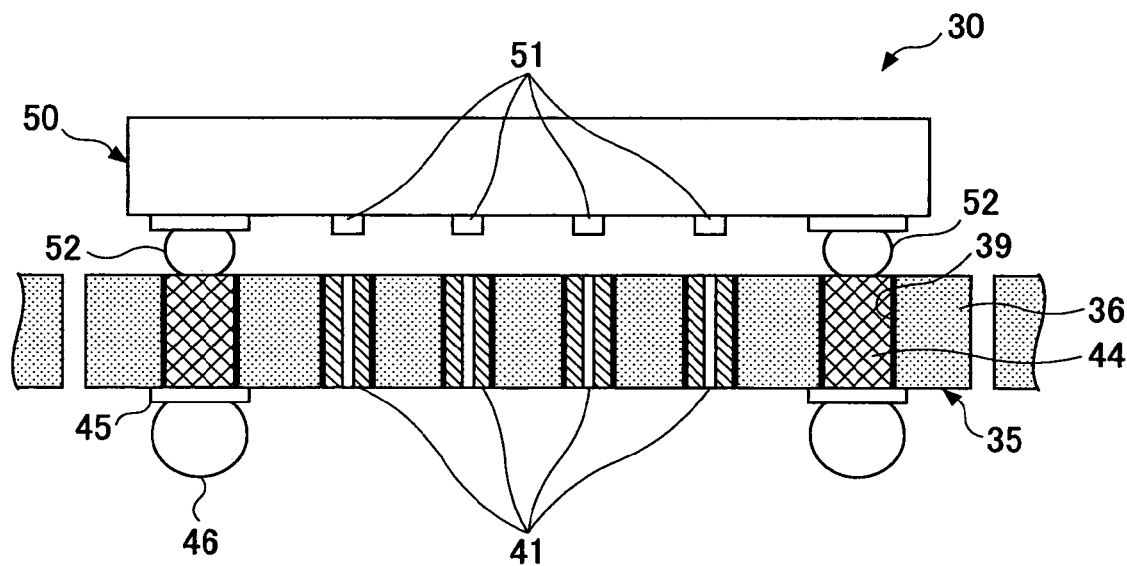
FIG. 19 is a cross-sectional view showing a process of manufacturing a semiconductor device according to a first embodiment of the present invention (Part 13)

Next, as shown in FIG. 18, in accordance with the measured results obtained with the photo-detection measurement apparatus, the optical element 50 is mounted on the substrate 35 in a manner that the solder balls 52 are electrically connected to the end parts 44a of the vias 44. Next, as shown in FIG. 19, the substrates 35 are individually cut out by dicing the silicon wafer 55, to thereby obtain multiple separated semiconductor devices 30. Accordingly, multiple semiconductor devices 30 can be fabricated at once.

By manufacturing the semiconductor devices 30 with the above-described manufacturing method using the silicon wafer 55 as the parent material, a large number of semiconductor devices 30 can be manufactured at once, the productivity of the semiconductor devices 30 can be improved, and the manufacturing cost of the semiconductor apparatus 30 can be reduced.

[Second Embodiment]

Figure 20:
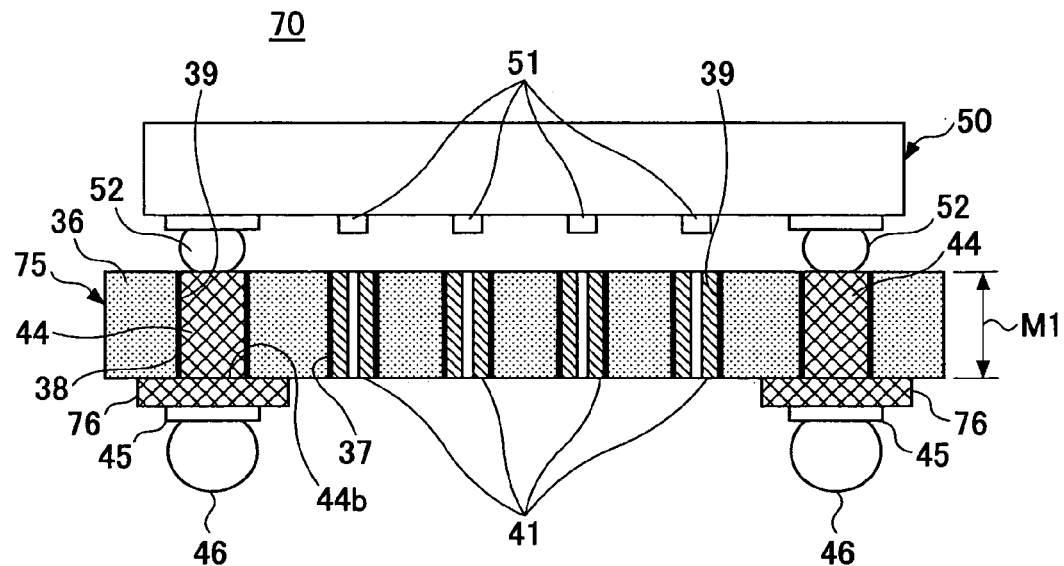
FIG. 20 is a cross-sectional view showing a semiconductor device according to a second embodiment of the present invention.

Next, a semiconductor device 70 according to a second embodiment of the present invention is described with reference to FIG. 20. FIG. 20 is a cross-sectional view showing a semiconductor device according to a second embodiment of the present invention. It is to be noted that the semiconductor device 70 of the second embodiment of the present invention is a modified example of the semiconductor device 30 according to the first embodiment of the present invention. Accordingly, in FIG. 20, like components are denoted with like numerals as of the semiconductor device 30 and explanation thereof is omitted.

The semiconductor device 70 mainly includes the optical element 50 and a substrate 75. The substrate 75 is an interposer. More specifically, the substrate 75 is a printed wiring board. The substrate 75 mainly includes the base material 36, the through-holes 37, 38, the insulating layer 39, the optical fibers 41, the vias 44, a land 76 (pad for connection), the Ni/Au alloy layers 45, and the solder balls 46.

The land 76 is provided between the end parts 44b of the vias 44 and the Ni/Au alloy layers 45. By providing the land 76 to the vias 44 on the side to which the motherboard (not shown) is mounted, the position of the solder balls 46, which are to be electrically connected to the motherboard, can be adjusted within the area at which the land 76 is situated. This increases the degree of freedom for mounting the semiconductor device 70 on the motherboard. It is to be noted that, likewise to the first embodiment of the present invention, the material used for the base material 36 of the second embodiment of the present invention is silicon which is more resistant to heat compared to resin. Furthermore, likewise to the first embodiment of the present invention, the through-holes 37 (to which the optical fibers 41 are provided) are formed by dry-etching. Accordingly, the through-holes 37 (i.e. core parts 42 of the optical fibers 41) can be positioned more accurately with respect to the light emission/reception part 51. Furthermore, displacement between the through-hole 37 and the light emission/reception part 51 (i.e. displacement between the core parts 42 of the optical fibers 41 and the light emission/reception parts 51) and deformation of the through-hole 37 can be prevented in a case where temperature of the substrate 75 is changed by heat from outside. Thus, the relative position between the core part 42 of the optical fiber 41 attached to the through-hole 37 and the light emission/reception part 51 can be prevented from changing. Thereby, transmission loss of optical signals between the optical fiber 41 and the light emission/reception part 51 can be reduced.

Next, a method of manufacturing the semiconductor device 70 according to the second embodiment of the present invention is described with reference to FIGS. 21–28. FIGS. 21 to 28 are drawings showing the processes of manufacturing the semiconductor device 70 according to the second embodiment of the present invention.

Likewise to the substrates 35 of the first embodiment of the present invention, the substrates 75 according to the second embodiment of the present invention are formed in multiple amounts at once on by using the silicon wafer 55 as the parent material. In the above-described processes shown in FIGS. 7 to 10, the through-holes 37, 38 are formed by dry-etching the silicon wafer 55. After the through-holes 37, 38 are formed by dry-etching, the silicon wafer 55 including the through-holes 37, 38 are oxidized in an oxide furnace, to thereby form the insulating layer 39 as an oxide film provided at the side walls 37A, 38A of the through-holes 37, 38 and the front and back planes of the silicon wafer 55.

Figure 21:
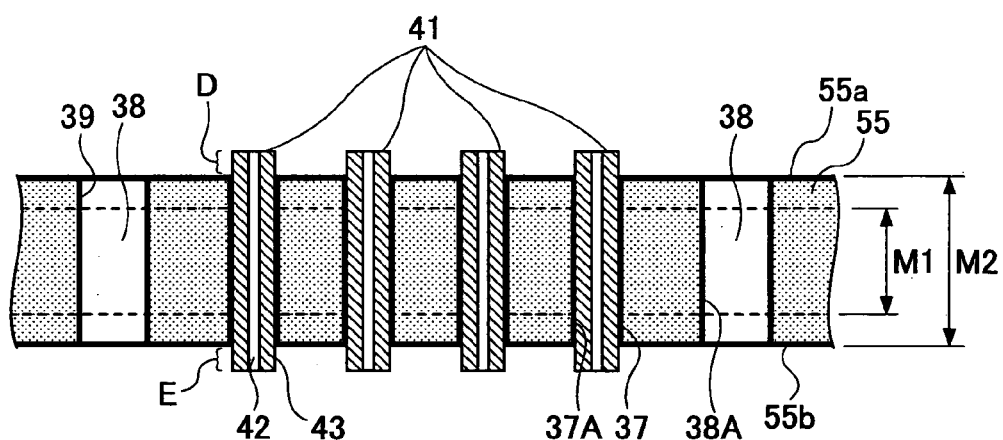
FIG. 21 is a cross-sectional view showing a process of manufacturing a semiconductor device according to a second embodiment of the present invention (Part 1)

Next, as shown in FIG. 21, the optical fibers 41 are inserted in the through-holes 37 and are attached to the walls 37A of the through-holes 37 by using an adhesive agent. In this step, the optical fibers 41 have protruding parts D and E protruding from planes 55a and 55b of the silicon wafer 55.

Figure 22:
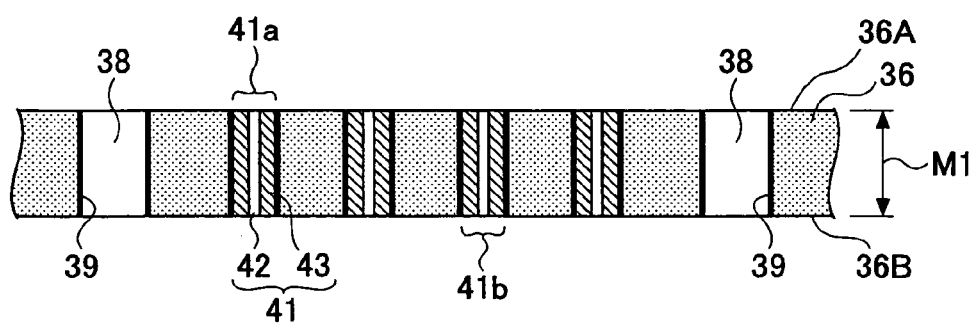
FIG. 22 is a cross-sectional view showing a process of manufacturing a semiconductor device according to a second embodiment of the present invention (Part 2)

Next, as shown in FIG. 22, both planes of the silicon wafer 55 are polished for forming the base material 36 with a desired thickness M1. In this step, at the same time, the protruding parts D, E of the optical fibers are also polished. As a result of the polishing process, the end parts 41a of the optical fibers become aligned at the same level (same plane) with the plane 36A of the base material 36, and the end parts 41b of the optical fibers become aligned at the same level (same plane) with the plane 36B of the base material 36. In the polishing process, a backside grinder, for example, may be used. In a case where the backside grinder is used, the silicon wafer 55 is polished one side at a time.

Figure 23:
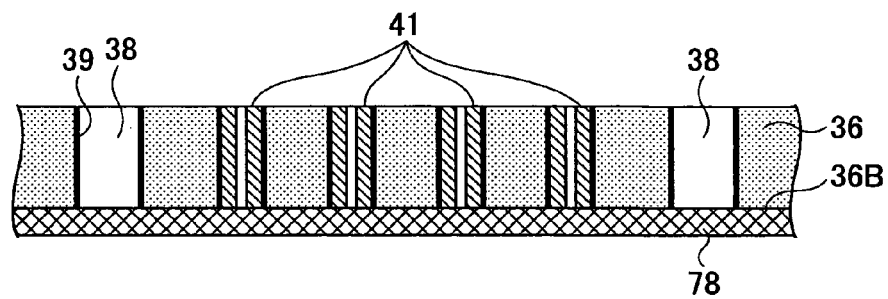
FIG. 23 is a cross-sectional view showing a process of manufacturing a semiconductor device according to a second embodiment of the present invention (Part 3)
Figure 24:
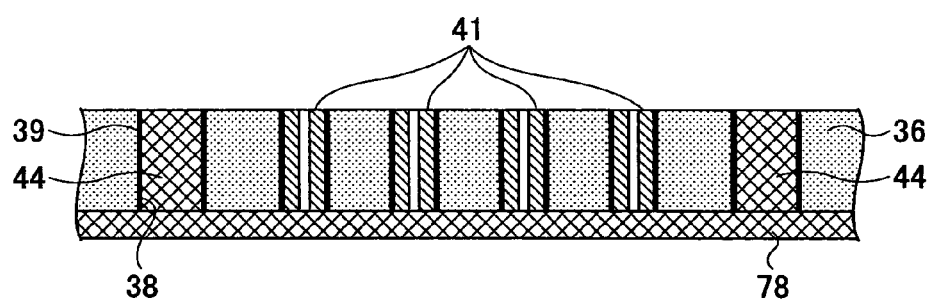
FIG. 24 is a cross-sectional view showing a process of manufacturing a semiconductor device according to a second embodiment of the present invention (Part 4)

Next, as shown in FIG. 23, a copper foil 78 (copper foil for supplying electric power) is disposed in a manner covering a bottom end part of the through-holes 38. The copper foil 78 serves as multiple power supply layers when forming alloy layers to the through-holes 38. Next, as shown in FIG. 24, a Cu film is formed in the through-holes 38 by an electro-plating method, to thereby form the vias 44.

Figure 25:
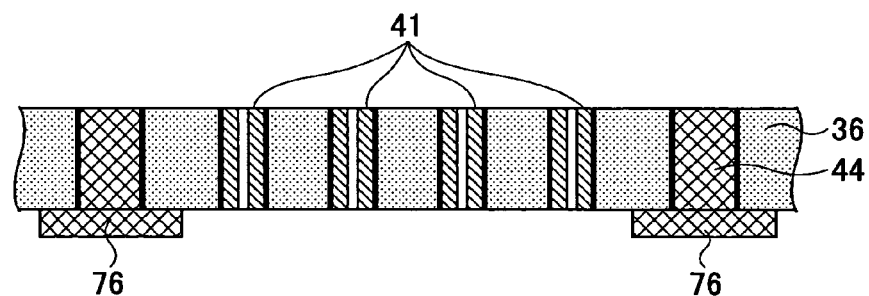
FIG. 25 is a cross-sectional view showing a process of manufacturing a semiconductor device according to a second embodiment of the present invention (Part 5)
Figure 26:
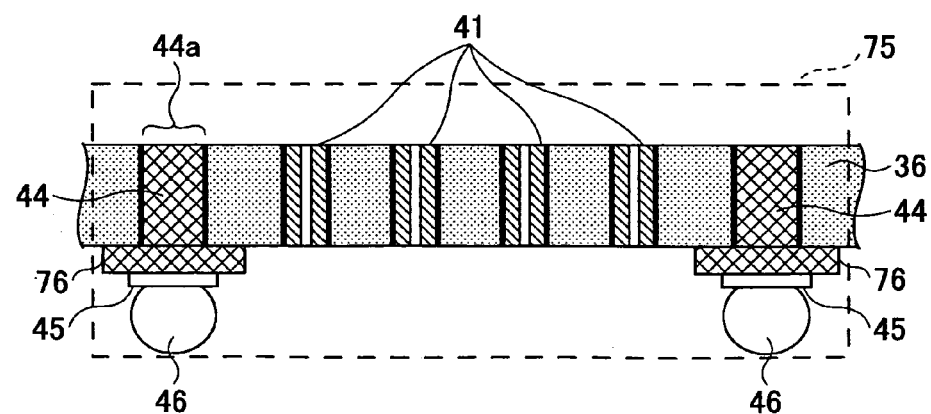
FIG. 26 is a cross-sectional view showing a process of manufacturing a semiconductor device according to a second embodiment of the present invention (Part 6)

Next, as shown in FIG. 25, the copper foil 78 is etched into a pattern. Then, the lands 76 are provided at the etched copper foils for electrically connecting with the vias 44. Next, as shown in FIG. 26, the Ni/Au alloy layers 45 are formed at the lands 76. Then, the solder balls 46 are formed on the Ni/Au alloy layers 45. Accordingly, multiple substrates 75 in a connected state (multiple substrates 75 in an inseparate state) are fabricated at once.

Figure 27:
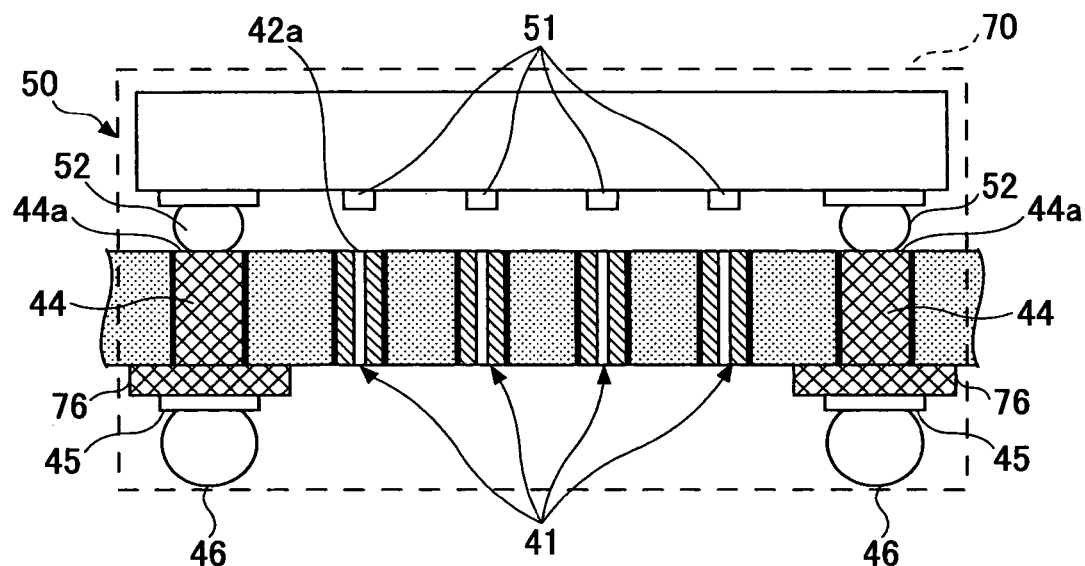
FIG. 27 is a cross-sectional view showing a process of manufacturing a semiconductor device according to a second embodiment of the present invention (Part 7)
Figure 28:
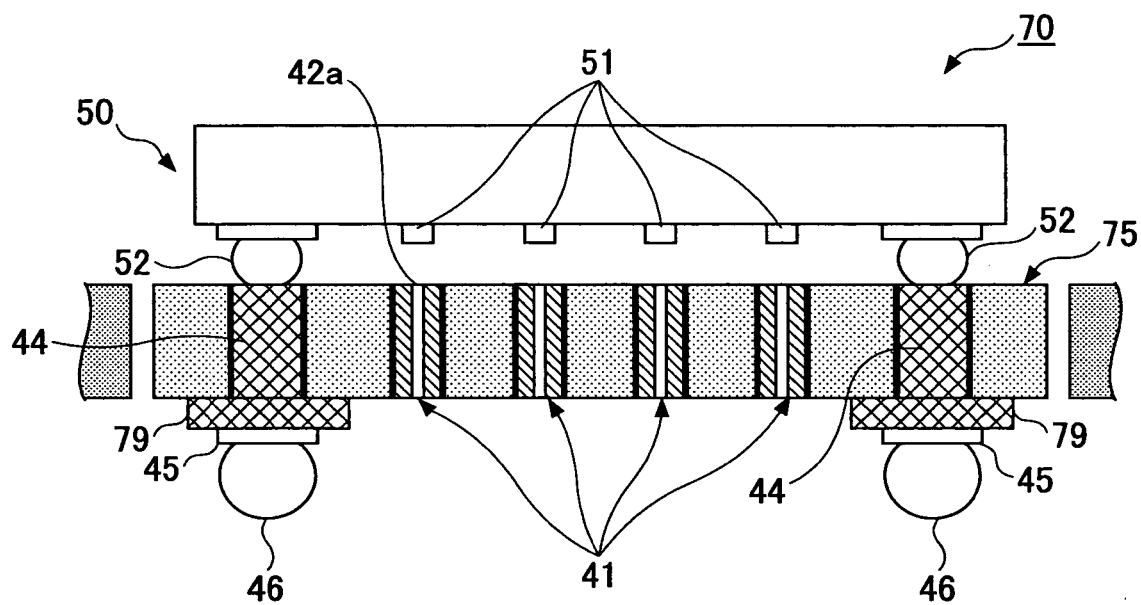
FIG. 28 is a cross-sectional view showing a process of manufacturing a semiconductor device according to a second embodiment of the present invention (Part 8).

Next, as shown in FIG. 27, the position between the light emission/reception parts 51 of the optical element 50 and the end parts 42a of the core part 42 are adjusted by monitoring the position with a photo-detection measurement apparatus (not shown), to thereby determine an optimum position on the base material 36 for mounting the optical element 50 (hereinafter referred to as "optimum position"). Then, in accordance with the measured results obtained with the photo-detection measurement apparatus, the solder balls 52 are electrically connected to the end parts 44a of the vias 44. Next, as shown in FIG. 28, the substrates 75 are individually cut out by dicing the silicon wafer 55, to thereby obtain multiple separated semiconductor devices 70. Accordingly, multiple semiconductor devices 70 can be fabricated at once.

By manufacturing the semiconductor devices 70 with the above-described manufacturing method using the silicon wafer 55 as the parent material, a large number of semiconductor devices 70 can be manufactured at once, the productivity of the semiconductor devices 70 can be improved, and the manufacturing cost of the semiconductor apparatus 70 can be reduced. It is to be noted that neither position nor the shape of the lands 76 are to be limited to those described in the lands 76 of this embodiment of the present invention. As long as the lands 76 are electrically connected to the vias 44, the lands 76 may alternatively be provided at different positions and/or in different shapes.

Further, the present invention is not limited to these embodiments, but various variations and modifications may be made without departing from the scope of the present invention.

The present application is based on Japanese Priority Application No. 2004-210191 filed on Jul. 16, 2004, with the Japanese Patent Office, the entire contents of which are hereby incorporated by reference.

What is claimed is:

1. A substrate for mounting an optical element having a light emission/reception part, the substrate comprising:
   a base material having first and second planes; and
   an optical waveguide penetrating through the base material from the first plane to the second plane, in a direction perpendicularly intersecting the optical element mounted on top of the first plane, the optical waveguide being positioned opposite to the light emission/reception part;
   wherein the base material is formed of silicon, and
   wherein the optical waveguide has first and second ends that protrude from the first and second planes and are polished to be flush with respect to the first and second planes prior to mounting the optical element to the substrate;
   wherein the distance between the polished first and second ends is substantially equal to the thickness of the substrate when mounting the optical element to the substrate.

2. The substrate as claimed in claim 1, wherein the base material further includes:
   a first through-hole to which the optical waveguide is attached;
   a second through-hole having a via for electrically connecting to the optical element;
   wherein the first and second through-holes are anisotroplo-etched holes.

3. The substrate as claimed in claim 2, wherein the second through-hole has a wall provided with an insulating layer.

4. The substrate as claimed in claim 2, wherein the via is provided with a connection pad on one side thereof, wherein the one side is situated opposite from the other side of the via for connecting to the optical element.

5. A semiconductor device comprising:
   a plurality of the optical elements of claim 1; and
   a plurality of the substrates of claim 1.

6. A method of manufacturing a substrate for mounting an optical element having a light emission/reception part, the substrate having a base material including first and second planes and an optical waveguide penetrating through the base material from the first plane to the second plane, in a direction perpendicularly intersecting the optical element mounted on top of the first plane, the optical waveguide having first and second ends that protrude from the first and second planes, the method comprising the steps of:
   forming the base material with a silicon material;
   forming a first through-hole and a second through-hole in the substrate by anisotropic etching;
   attaching the optical waveguide to the first through-hole:
   forming a via in the second through-hole; and
   polishing the first and second ends protruding from the first and second planes to be flush with respect to the first and second planes prior to mounting the optical element to the substrate;
   wherein the distance between the polished first and second ends is substantially equal to the thickness of the substrate when mounting the optical element to the substrate.

7. The method as claimed in claim 6, wherein the first through-hale and the second through-hole are formed simultaneously.

8. The method as claimed in claim 6, further comprising the steps of:
   forming an insulating layer at least at a wall of the second through-hole.

9. The method as claimed in claim 8, further comprising a step of providing a connection pad on one side of the via, wherein the one side is situated opposite from the other side of the via for connecting to the optical element.

10. A method of manufacturing a plurality of substrates for mounting optical elements having light emission/reception parts, each of the substrates having a base material including first and second planes and an optical waveguide penetrating through the base material from the first plane to the second plane, in a direction perpendicularly intersecting the optical element mounted on top of the first plane, the optical waveguide having first and second ends that protrude from the first and second planes, the method comprising the steps of:
   forming the base material with a silicon material;
   forming a first through-hole and a second through-hole in the substrate by anisotropic etching;
   attaching the optical waveguide to the first through-hole;
   forming a via in the second through-hole;
   polishing the first and second ends protruding from the first and second planes to be flush with respect to the first and second planes;
   mounting the optical elements on the substrates after the polishing step; and
   cutting out the substrates mounted with the optical elements by dicing the base material;
   wherein the distance between the polished first and second ends is substantially equal to the thickness of the substrate when mounting the optical elements to the substrates.

* * * * *